United States Patent
Muraoka

(10) Patent No.: US 11,073,493 B2
(45) Date of Patent: *Jul. 27, 2021

(54) SENSOR DEVICE

(71) Applicant: ABLIC Inc., Chiba (JP)

(72) Inventor: Daisuke Muraoka, Chiba (JP)

(73) Assignee: ABLIC INC., Chiba (JP)

( * ) Notice: Subject to any disclaimer, the term of this patent is extended or adjusted under 35 U.S.C. 154(b) by 230 days.

This patent is subject to a terminal disclaimer.

(21) Appl. No.: 16/191,963

(22) Filed: Nov. 15, 2018

(65) Prior Publication Data

US 2019/0154615 A1 May 23, 2019

(30) Foreign Application Priority Data

Nov. 17, 2017 (JP) .............................. JP2017-221693

(51) Int. Cl.
*G01N 27/22* (2006.01)
*H03K 17/955* (2006.01)
*G01R 27/26* (2006.01)
*G01B 7/06* (2006.01)
*G03G 15/00* (2006.01)

(52) U.S. Cl.
CPC ......... *G01N 27/22* (2013.01); *G01R 27/2605* (2013.01); *G03G 15/5029* (2013.01); *H03K 17/955* (2013.01)

(58) Field of Classification Search
CPC .. G01N 27/22; G03G 15/5029; H03K 17/955; G01R 27/2605; G01R 27/26; G01R 35/00; G01R 19/0061; G01R 1/30; G01R 29/24; G01B 29/24; G01D 5/24; G01D 5/2417; G01D 5/2405; G01D 3/032; G01D 5/241; G06F 3/044; G06F 3/0416; G06F 3/0418; G06F 3/0446; G06K 9/0002; G01P 15/125

See application file for complete search history.

(56) References Cited

U.S. PATENT DOCUMENTS

| 5,612,494 | A | * | 3/1997 | Shibano | ................ G01P 15/125 |
| | | | | | 73/514.18 |
| 6,278,283 | B1 | * | 8/2001 | Tsugai | ............... G01R 27/2605 |
| | | | | | 324/678 |
| 6,538,693 | B1 | | 3/2003 | Kozuka | |
| 9,151,792 | B1 | * | 10/2015 | Kremin | ............. G01R 27/2605 |
| 10,309,997 | B2 | * | 6/2019 | Wurzinger | ........... H04R 19/005 |
| 2003/0057967 | A1 | * | 3/2003 | Lien | ...................... G01R 31/64 |
| | | | | | 324/683 |

(Continued)

FOREIGN PATENT DOCUMENTS

JP  H09-205588 A  8/1997

*Primary Examiner* — Lee E Rodak
(74) *Attorney, Agent, or Firm* — Brinks Gilson & Lione

(57) ABSTRACT

To reduce effects of noise and improve detection accuracy, a sensor device includes: a detection electrode opposing an external electrode to which a predetermined voltage is applied, and configured to generate a voltage corresponding to a change in electrostatic capacitance; and a capacitive amplifier circuit having a first capacitor and a second capacitor connected in series to each other, and configured to detect the voltage generated in the detection electrode, and output a detection signal obtained by amplifying the voltage generated in the detection electrode based on a capacitance ratio between the first capacitor and the second capacitor.

8 Claims, 5 Drawing Sheets

(56) References Cited

U.S. PATENT DOCUMENTS

2013/0207677 A1* 8/2013 Togura ............... G01R 27/2605
324/685
2015/0137834 A1* 5/2015 Steiner .................. H04R 19/04
324/686
2016/0306061 A1* 10/2016 Lamesch .................. G01V 3/08

* cited by examiner

SENSOR DEVICE

RELATED APPLICATIONS

This application claims priority under 35 U.S.C. § 119 to Japanese Patent Application No. 2017-221693 filed on Nov. 17, 2017, the entire content of which is hereby incorporated by reference.

BACKGROUND OF THE INVENTION

1. Field of the Invention

The present invention relates to a sensor device.

2. Description of the Related Art

In recent years, a sensor device including a sensor has been known (refer to Japanese Patent Application Laid-open No. H9-205588, for example). In such a sensor device, a voltage generated in a photoelectric element is detected with a source follower, for example.

However, in a sensor device including, instead of the photoelectric element, a detection electrode which opposes an external electrode applied with a voltage, and in which a voltage is generated by a change in electrostatic capacitance, for example, a detection voltage which is the voltage generated in the detection electrode is minute, and hence the detection voltage is amplified in a subsequent stage of the source follower for use. In such a related-art sensor device, the detection voltage as well as a noise component is amplified.

SUMMARY OF THE INVENTION

According to one embodiment of the present invention, there is provided a sensor device including: a detection electrode opposing an external electrode to which a predetermined voltage is applied, and configured to generate a voltage corresponding to a change in electrostatic capacitance; and a capacitive amplifier circuit having a first capacitor and a second capacitor connected in series to each other, and configured to detect the voltage generated in the detection electrode and output a detection signal obtained by amplifying the voltage generated in the detection electrode based on a capacitance ratio between the first capacitor and the second capacitor.

According to the present invention, effects of noise can be reduced, and detection accuracy can be improved.

DETAILED DESCRIPTION OF THE PREFERRED EMBODIMENTS

Now, embodiments of the present invention will be described with reference to the accompanying drawings.

First Embodiment

Figure 1:
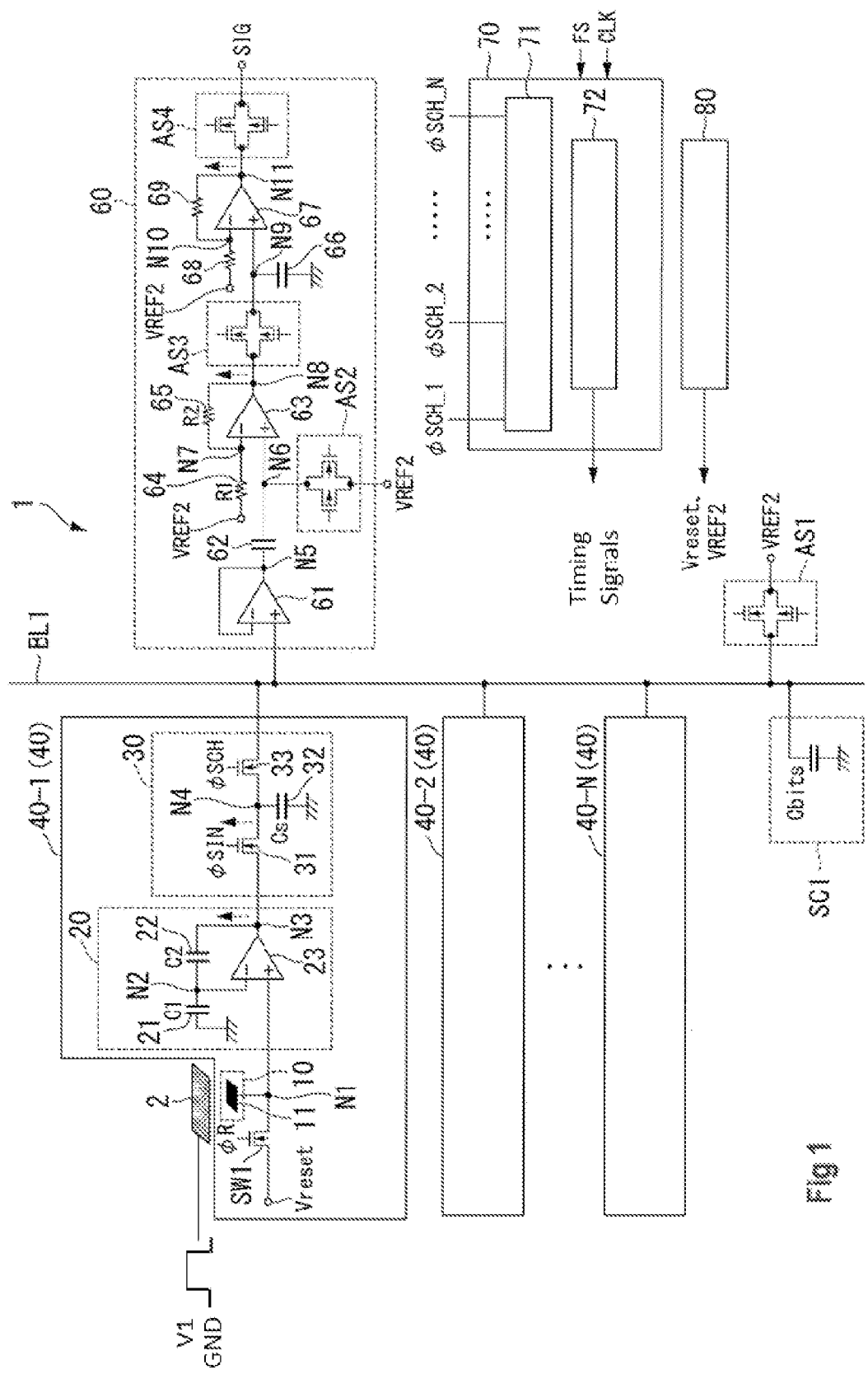
FIG. 1 is a block diagram for illustrating an example of a sensor device according to a first embodiment of the present invention.

FIG. 1 is a block diagram for illustrating an example of a sensor device 1 according to the first embodiment of the present invention.

As illustrated in FIG. 1, the sensor device 1 includes an external electrode 2, pixel blocks (40-1, 40-2, . . . , 40-N), an output processing circuit 60, a timing control circuit 70, and a reference voltage generation circuit 80. The sensor device 1 is, for example, a line image sensor device which detects an image of a thickness of a paper sheet such as a banknote, with the use of an electrostatic capacitance. The sensor device 1 serially outputs detection voltages indicating one line of pixels from a SIG terminal. The pixel blocks (40-1, 40-2, . . . , 40-N), the output processing circuit 60, the timing control circuit 70, and the reference voltage generation circuit 80 are formed as a semiconductor integrated circuit (large-scale integration: LSI) on one chip, for example, and the sensor device 1 includes the one-chip semiconductor integrated circuit (LSI) and the external electrode 2.

In the first embodiment, the pixel blocks (40-1, 40-2, . . . , 40-N) have the same configuration, and are described as the pixel block(s) 40 when any one of the pixel blocks included in the sensor device 1 is referred to, or when the pixel blocks are not particularly distinguished from one another.

The external electrode 2 is an electrode arranged outside the pixel block 40, and is arranged to correspond to a detection electrode 11 which is described later. The external electrode 2 is applied with a predetermined voltage V1 when the pixel block 40 detects an electric field (which corresponds to a thickness of the paper sheet) of each pixel. In the first embodiment, the external electrode 2 is formed as one electrode for all detection electrodes 11 included in the sensor device 1.

The pixel block 40 is a block configured to detect the electric field (thickness) of a pixel, and includes a sensor unit 10 which includes the detection electrode 11, a bit amplifier circuit 20, a sampling circuit 30, and a reset switch SW1.

The detection electrode 11 opposes the external electrode 2, and a voltage corresponding to a change in capacitance caused by the thickness of the paper sheet, for example, the banknote, inserted between the external electrode 2 and the detection electrode 11 is generated in the detection electrode 11. The detection electrodes 11 respectively included in the plurality of pixel blocks 40 are arranged in a line to detect pixels line by line.

The bit amplifier circuit 20 (one example of a capacitive amplifier circuit) has a capacitor 21 (first capacitor) and a capacitor 22 (second capacitor) which are connected in series to each other to detect the voltage generated in the detection electrode 11, and output a detection signal obtained by amplifying, based on a capacitance ratio between the capacitor 21 and the capacitor 22, the voltage generated in the detection electrode 11. The bit amplifier circuit 20 has the capacitor 21, the capacitor 22, and an operational amplifier 23.

The capacitor 21 and the capacitor 22 are connected in series to each other via a node N2. In other words, the capacitor 21 is connected between a ground (GND) line (one example of a reference potential line) and the node N2, and the capacitor 22 is connected between a node N3 and the node N2.

The operational amplifier 23 has a non-inverting input terminal connected to the detection electrode 11 via a node N1. The operational amplifier 23 also has the capacitor 22 connected between an output terminal (node N3) and an inverting input terminal thereof, and has the capacitor 21 connected between the inverting input terminal and the reference potential line. The operational amplifier 23 is connected to the capacitor 21 and the capacitor 22 as described above to function as a non-inverting amplifier circuit.

As described above, the bit amplifier circuit 20 is a capacitive non-inverting amplifier circuit (one example of a capacitive amplifier), and outputs the detection signal obtained by amplifying, by the following equation (1), the voltage generated in the detection electrode 11.

$$\text{Gain}=(C1+C2)/C2 \tag{1}$$

In the equation (1), C1 is a capacitance of the capacitor 21, and C2 is a capacitance of the capacitor 22.

In FIG. 1, the broken-line arrows indicate positive and negative directions of signals, and the bit amplifier circuit 20 (operational amplifier 23) outputs a detection signal in the positive direction.

The reset switch SW1 is an N-channel metal-oxide-semiconductor (MOS) transistor, for example, and is connected between a Vreset signal line and the node N1. The reset switch SW1 also has a gate terminal (control terminal) connected to a ΦR signal line. Here, a Vreset signal is a reference potential for initializing (resetting) the detection electrode 11. The reset switch SW1 resets the voltage of the detection electrode 11 to the reference potential Vreset.

For example, the reset switch SW1 enters an ON state (conductive state) when a ΦR signal is in a high (H) state to reset the detection electrode 11. Moreover, the reset switch SW1 enters an OFF state (non-conductive state) when the ΦR signal is in a low (L) state.

In the following description, the above-mentioned N-channel MOS transistor is referred to as the "NMOS transistor".

The sampling circuit 30 is a sample-and-hold circuit configured to sample and hold the detection signal provided from the bit amplifier circuit 20. The sampling circuit 30 has NMOS transistors (31 and 33) and a capacitor 32.

The NMOS transistor 31 is connected between the node N3 and a node N4, and has a gate terminal connected to a ΦSIN signal line. The NMOS transistor 31 enters an ON state when a ΦSIN signal is in an H state to sample the detection signal provided from the bit amplifier circuit 20, and hold the detection signal in the capacitor 32. Moreover, the NMOS transistor 31 enters an OFF state when the ΦSIN signal is set to an L state to stop sampling the detection signal provided from the bit amplifier circuit 20.

The capacitor 32 is connected between the node N4 and a GND line to hold the sampled detection signal.

The NMOS transistor 33 is connected between the node N4 and a common signal line BL1, and has a gate terminal connected to a ΦSCH signal line. The NMOS transistor 33 enters an ON state when a ΦSCH signal is in an H state to output the detection signal held by the sampling circuit 30 (capacitor 32) to the common signal line BL1. Moreover, the NMOS transistor 33 enters an OFF state when the ΦSCH signal line is set to an L state to stop outputting to the common signal line BL1.

To the common signal line BL1, the sampling circuit 30 of each of the pixel blocks (40-1, 40-2, . . . , 40-N) is connected. The sampling circuits 30 of the respective pixel blocks 40 each output one pixel to the common signal line BL1 in response to ΦSCH signals (ΦSCH_1 signal, ΦSCH_2 signal, . . . , ΦSCH_N signal) respectively corresponding to the pixel blocks 40. Moreover, the common signal line BL1 has a parasitic capacitance SC1.

A gain in the sampling circuit 30 is expressed by the following equation (2).

$$\text{Gain}=Cs/(Cs+Cbits) \tag{2}$$

In the equation (2), Cs is a capacitance of the capacitor 32, and Cbits is a parasitic capacitance of the common signal line BL1.

Moreover, to the common signal line BL1, an analog switch AS1 is connected.

The analog switch AS1 is connected between the common signal line BL1 and a VREF2 signal line. The analog switch AS1 is formed by pairing an NMOS transistor and a P-channel MOS transistor (PMOS transistor) to each other, and establishes bidirectional conduction between the common signal line BL1 and the VREF2 signal line in response to a control signal. When the control signal turns on the analog switch AS1, the common signal line BL1 is set to a reference potential VREF2.

The output processing circuit 60 acquires the detection signals from the pixel blocks 40 via the common signal line BL1 one bit (one pixel) at a time, amplifies the acquired detection signals, and output the amplified detection signals from the SIG terminal. The output processing circuit 60 has operational amplifiers (61, 63, and 67), capacitors (62 and 66), resistors (64, 65, 68, and 69), and analog switches (AS2 to AS4).

The operational amplifier 61 has a non-inverting input terminal connected to the common signal line BL1, and an output terminal (node N5) connected to an inverting input terminal thereof. The operational amplifier 61 functions as a voltage follower having a gain of 1, and outputs a signal equal to the detection signal acquired via the common signal line BL1 to the output terminal (node N5).

The capacitor 62 is connected between the node N5 and a node N6 to transfer the detection signal provided from the operational amplifier 61 to the node N6. The capacitor 62 converts the detection signal into a signal with reference to the reference potential VREF2 by transferring the detection signal to the node N6 that has been set to the reference potential VREF2 by the analog switch AS2 to be described below.

The analog switch AS2 has a configuration similar to that of the analog switch AS1 described above, and is connected between the node N6 and the VREF2 signal line. The analog switch AS2 establishes conduction between the node N6 and the VREF2 signal line in response to a control signal, and sets the node N6 to the reference potential VREF2.

The operational amplifier 63 has a non-inverting input terminal connected to the node N6, an inverting input terminal connected to a node N7, and an output terminal connected to a node N8. Moreover, the resistor 64 and the resistor 65 are connected in series to each other between the node N8 and the VREF2 signal line, and the operational amplifier 63 functions as a non-inverting amplifier circuit which amplifies a signal at the node N6 based on a resistance ratio between the resistor 64 and the resistor 65. In other words, the operational amplifier 63 outputs the detection signal that has been amplified by the following equation (3) to the node N8.

$$Gain=(R1+R2)/R1 \qquad (3)$$

In the equation (3), R1 is a resistance of the resistor 64, and R2 is a resistance of the resistor 65.

The analog switch AS3 has a configuration similar to that of the analog switch AS1 described above, and is connected between the node N8 and a node N9. The analog switch AS3 establishes conduction between the node N8 and the node N9 in response to a control signal so that the capacitor 66 holds the detection signal that has been amplified by the operational amplifier 63.

The capacitor 66 is connected between the node N9 and the GND line to hold the detection signal that has been amplified by the operational amplifier 63. The analog switch AS3 and the capacitor 66 form a sample-and-hold circuit.

The operational amplifier 67 has a non-inverting input terminal connected to the node N9, an inverting input terminal connected to a node N10, and an output terminal connected to a node N11. Moreover, the resistor 68 and the resistor 69 are connected in series to each other between the node N11 and the VREF2 signal line, and the operational amplifier 67 functions as a non-inverting amplifier circuit configured to amplify a signal at the node N9 based on a resistance ratio between the resistor 68 and the resistor 69. In other words, the operational amplifier 67 outputs to the node N11 the detection signal obtained by further amplifying the signal at the node N9 held in the capacitor 66, by the following equation (4).

$$Gain=(R3+R4)/R3 \qquad (4)$$

In the equation (4), R3 is a resistance of the resistor 68, and R4 is a resistance of the resistor 69.

The analog switch AS4 has a configuration similar to that of the analog switch ASI described above, and is connected between the node N11 and the SIG terminal. The analog switch AS4 establishes conduction between the node N11 and the SIG terminal in response to a control signal, and outputs the detection signal that has been amplified by the operational amplifier 67 to the SIG terminal.

The timing control circuit 70 generates various timing signals for controlling the sensor device 1. For example, the timing control circuit 70 generates, for the pixel blocks 40, various timing signals for detecting the voltage generated in the detection electrode 11 based on a frame start (FS) signal and a clock (CLK) signal, for example. Moreover, the timing control circuit 70 generates, based on the FS signal, for example, the ΦSCH signals (ΦSCH_1 signal, ΦSCH_2 signal, . . . , ΦSCH_N signal) for outputting the detection signals from the pixel blocks 40 to the common signal line BL1. The timing control circuit 70 includes a shift resistor 71 and a timing signal generation circuit 72.

The shift resistor 71 is shifted by the CLK signal and sequentially outputs H states each having a predetermined pulse width as the ΦSCH signals (ΦSCH_1 signal, (ΦSCH_2 signal, . . . , ΦSCH_N signal) for providing the detection signals from the pixel blocks 40 to the common signal line BL1. In response to the output ΦSCH signals (ΦSCH_1 signal, ΦSCH_2 signal, . . . , ΦSCH_N signal), the detection signals are provided from the pixel blocks 40 to the common signal line BL1 one pixel (one bit) at a time.

The timing signal generation circuit 72 generates the ΦR signal, the ΦSIN signal, a ΦI signal, and the control signals for controlling the various analog switches (AS1 to AS4), for example, and outputs the generated signals to the components.

The reference voltage generation circuit 80 generates reference potentials (reference voltages) for various analog circuits used in the sensor device 1, and supplies the generated reference potentials to the components. The reference voltage generation circuit 80 is configured to generate reference potentials, such as the reference potential VREF2 and the reference potential Vreset, for example.

Next, operation of the sensor device 1 according to the first embodiment is described with reference to the accompanying drawings.

Figure 2:
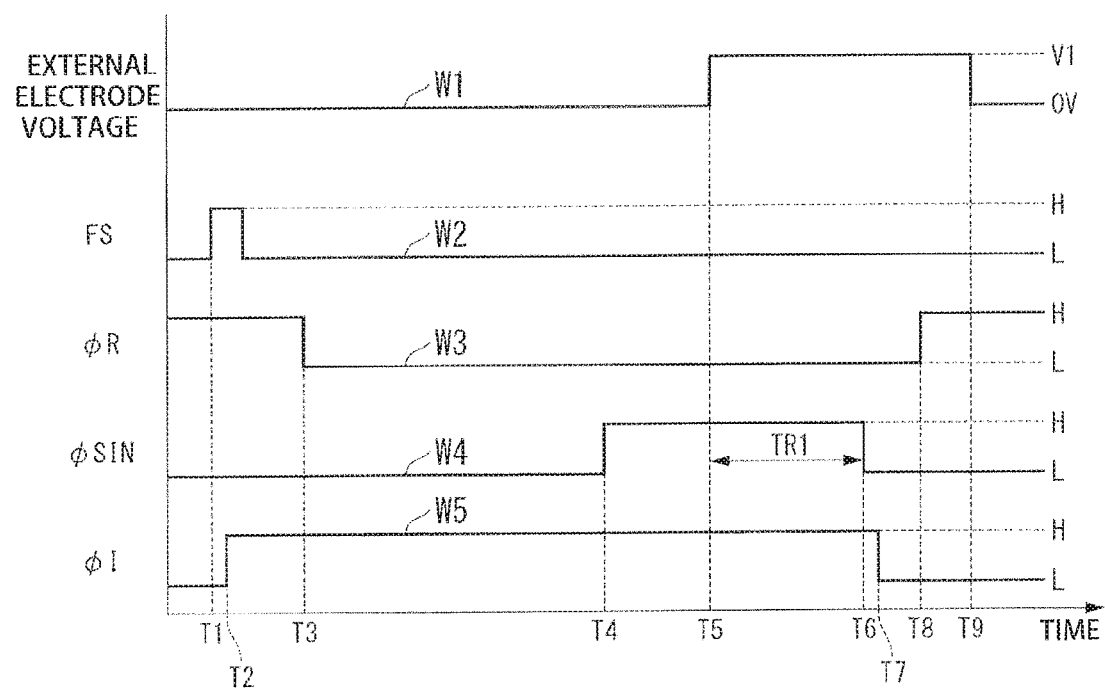
FIG. 2 is a timing chart for showing an example of operation of the sensor device according to the first embodiment.

FIG. 2 is a timing chart for showing one example of the operation of the sensor device 1 according to the first embodiment.

In the one example shown in FIG. 2, a description is given of operation of the sensor device 1 until the voltage of the detection electrode 11 is detected and the detected detection signal is held by the sampling circuit 30.

In FIG. 2, a waveform W1 indicates a waveform of the voltage of the external electrode 2 (external electrode voltage). Moreover, a waveform W2 to a waveform W5 indicate, in order from above, a logic state of the FS signal, a logic state of the ΦR signal, a logic state of the ΦSIN signal, and a logic state of the ΦI signal. In FIG. 2, the horizontal axis indicates time. Moreover, the ΦI signal is a control signal for operating the bit amplifier circuit 20 (for example, control signal for turning ON/OFF a bias current of the operational amplifier 23).

As shown in FIG. 2, it is assumed that the timing signal generation circuit 72 sets, as an initial condition, the ΦR signal to the H state and the ΦSIN signal and the ΦI signal to the L state. In this condition, the reset switch SW1 enters the ON state to reset the voltage of the detection electrode 11 to the reference potential Vreset. Under this condition, when the FS signal is set to a H state at time T1, the timing signal generation circuit 72 sets the ΦI signal to a H state at time T2 (see the waveform W5) to start operation of the operational amplifier 23.

Next, when the timing signal generation circuit 72 sets the ΦR signal to the L state at time T3 (see the waveform W3), the reset switch SW1 enters the OFF state.

Next, when the timing signal generation circuit 72 sets the ΦSIN signal to the H state at time T4 (see the waveform W4), the NMOS transistor 31 of the sampling circuit 30 enters the ON state to accumulate an output signal of the bit amplifier circuit 20 in the capacitor 32.

Next, when the predetermined voltage V1 is applied to the external electrode 2 at time T5 (see the waveform W1), the voltage corresponding to the change in capacitance caused by the thickness of the paper sheet is generated in the detection electrode 11. The bit amplifier circuit 20 outputs, to the node N3, the detection signal obtained by amplifying the voltage generated in the detection electrode 11 with the gain of the equation (1) described above. The sampling circuit 30 accumulates the detection signal in the capacitor 32 via the NMOS transistor 31.

Next, after a predetermined period TR1 elapses at time T6 since the application of the predetermined voltage V1 to the external electrode 2, the timing signal generation circuit 72 sets the ΦSIN signal to the L state (see the waveform W4). Here, the predetermined period TR1 is a period that is enough for the detection signal that is amplified by the operational amplifier 23 to accumulate in the capacitor 32 of the sampling circuit 30. When the ΦSIN signal is set to the L state, the NMOS transistor 31 enters the OFF state to complete the sample and hold by the sampling circuit 30, and the amplified detection signal are held in the capacitor 32. Here, the detection signals of all pixels of one line of the pixel block 40-1, the pixel block 40-2, . . . , the pixel block 40-N are held by the respective sampling circuits 30.

Next, at time T7, the timing signal generation circuit 72 sets the ΦI signal to the L state to stop the operation of the operational amplifier 23.

Moreover, at time T8, the timing signal generation circuit 72 sets the ΦR signal to the H state to turn on the reset switch SW1 to reset the detection electrode 11 to the reference potential Vreset.

Next, at time T9, the application of the predetermined voltage V1 to the external electrode 2 is stopped, and the voltage (external electrode voltage) of the external electrode 2 becomes 0 V, for example (see the waveform W1).

Next, referring to FIG. 1, a description is given of operation of serially outputting the detection signals held by the sampling circuits 30.

After the sampling circuit 30 holds the detection signal, the timing signal generation circuit 72 first turns on the analog switch AS1 and the analog switch AS2 to set the common signal line BL1 and the node N6 to the reference potential VREF2.

Next, after the timing signal generation circuit 72 turns off the analog switch AS1 and the analog switch AS2, the shift resistor 71 sets the ΦSCH_1 signal to the H state to turn on the NMOS transistor 33 of the pixel block 40-1 to output the detection signal held by the sampling circuit 30 to the common signal line BL1.

Next, the operational amplifier 63 of the output processing circuit 60 acquires, via the operational amplifier 61 and the capacitor 62, the detection signal provided to the common signal line BL1, amplifies the acquired detection signal with the gain expressed by the equation (3) described above, and outputs the amplified detection signal to the node N8.

Next, the timing signal generation circuit 72 turn on the analog switch AS3 to hold the detection signal that has been amplified by the operational amplifier 63 in the capacitor 66. In this manner, the operational amplifier 67 amplifies the detection signal held in the capacitor 66 with the gain expressed by the equation (4) described above, and outputs the amplified detection signal to the node N11.

Next, after tuning off the analog switch AS3, the timing signal generation circuit 72 turns on the analog switch AS4 to output the detection signal that is amplified by the operational amplifier 67 as a detection voltage of one pixel to the SIG terminal.

Next, the timing control circuit 70 executes processing similar to that for the pixel block 40-1 on the pixel block 40-2. In this case, the shift resistor 71 is shifted by the CLK signal to set the ΦSCH_2 signal to the H state such that the output processing circuit 60 outputs the detection signal of the pixel block 40-2 as a detection voltage of one pixel to the SIG terminal.

The timing control circuit 70 repeats such processing until the detection signal of the pixel block 40-N is provided to the SIG terminal.

As described above, the sensor device 1 according to the first embodiment includes the detection electrode 11 and the bit amplifier circuit 20 (capacitive amplifier circuit). The detection electrode 11 opposes the external electrode 2 which is applied with the predetermined voltage V1, and the voltage corresponding to the change in capacitance is generated therein. The bit amplifier circuit 20 includes the capacitor 21 (first capacitor) and the capacitor 22 (second capacitor) which are connected in series to each other, to detect the voltage generated in the detection electrode 11, and output the detection signal obtained by amplifying, based on the capacitance ratio between the capacitor 21 and the capacitor 22, the voltage generated in the detection electrode 11.

Since the sensor device 1 according to the first embodiment thereby amplifies the voltage generated in the detection electrode 11 by the bit amplifier circuit 20, and outputs the amplified voltage as the detection signal, the effects of noise, for example, thermal noise can be reduced in processing in a subsequent stage of the bit amplifier circuit 20, for example. Accordingly, the sensor device 1 according to the first embodiment can improve detection accuracy.

Moreover, the sensor device 1 according to the first embodiment can increase a dynamic range and a signal-to-noise ratio (SN ratio) by further amplifying the detection signal in the processing in the subsequent stage. Moreover, with the sensor device 1 according to the first embodiment, it is not required to amplify the detection signal outside the sensor device 1a nymore, and hence a configuration of the entire system employing the sensor device 1 according to the first embodiment can be simplified.

Moreover, in a standard semiconductor process, a capacitor can be implemented with a size (area) that is smaller than that of a resistive element, and hence the sensor device 1 according to the first embodiment can reduce a process cost.

Moreover, the sensor device 1 according to the first embodiment includes the plurality of detection electrodes 11 arranged in line, and the plurality of bit amplifier circuits 20 respectively corresponding to the plurality of detection electrodes 11.

As a result, the sensor device 1 according to the first embodiment can reduce the effect of noise, and implement a line sensor with improved detection accuracy.

Second Embodiment

Next, a sensor device 1a according to a second embodiment of the present invention is described with reference to the accompanying drawings.

In the second embodiment, a description is given of a case in which a function for reducing an offset is added to the sensor device 1 according to the first embodiment.

Figure 3:
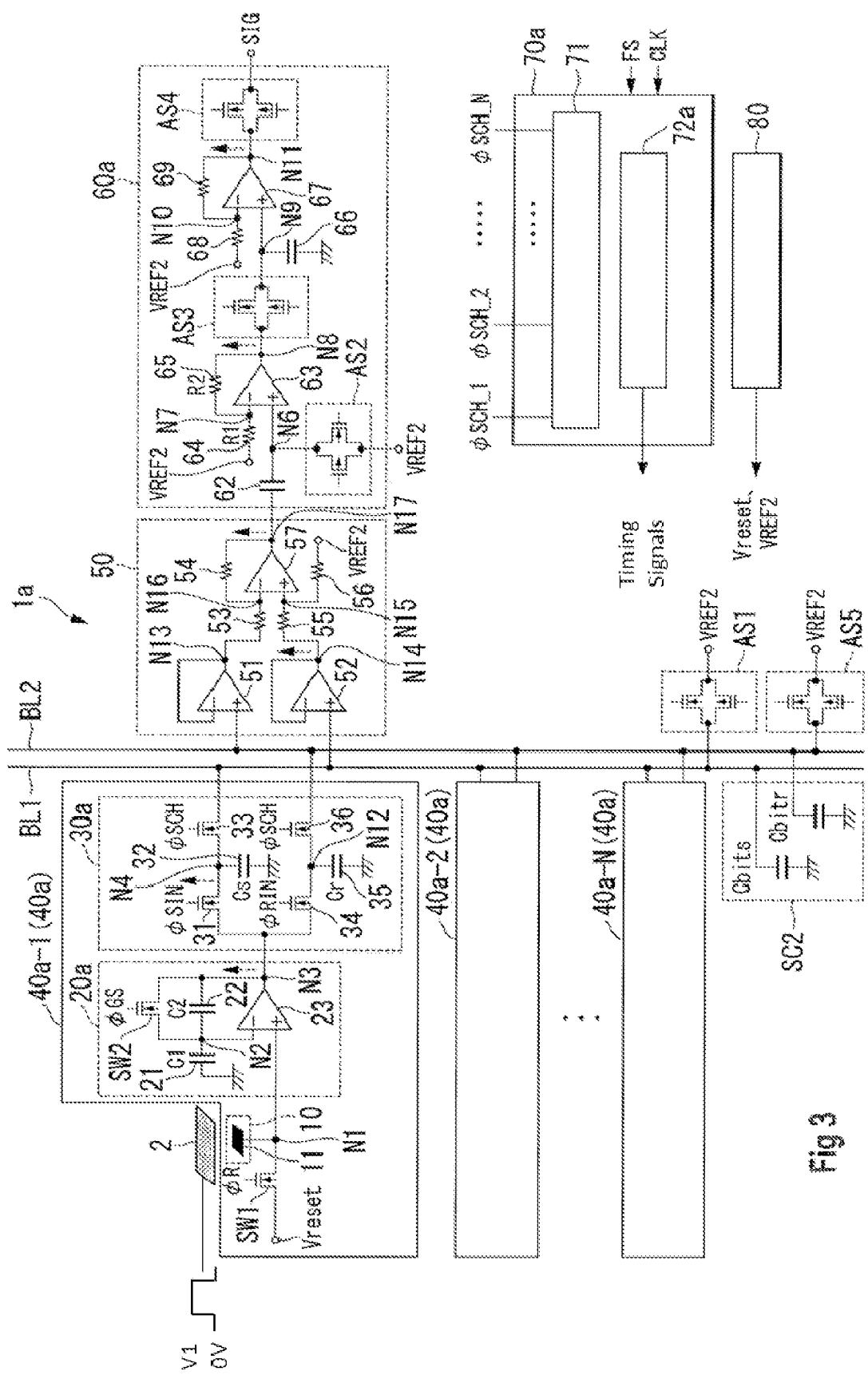
FIG. 3 is a block diagram for illustrating an example of a sensor device according to a second embodiment of the present invention.

FIG. 3 is a block diagram for illustrating one example of the sensor device 1a according to the second embodiment.

As illustrated in FIG. 3, the sensor device 1a includes an external electrode 2, pixel blocks (40a-1, 40a-2, . . . , 40a-N), a subtraction circuit 50, an output processing circuit 60a, a timing control circuit 70a, and a reference voltage generation circuit 80.

In FIG. 3, the same components as those of the first embodiment illustrated in FIG. 1 are denoted by the same reference symbols, and a description thereof is omitted.

Moreover, in the second embodiment, the pixel blocks (40a-1, 40a-2, . . . , 40a-N) have the same configuration, and are described as the pixel block(s) 40a when any one of the pixel blocks included in the sensor device 1a is referred to, or when the pixel blocks are not particularly distinguished from one another.

The pixel block 40a is a block configured to detect the electric field (thickness) of a pixel, and includes the detection electrode 11, a bit amplifier circuit 20a, a sampling circuit 30a, and a reset switch SW1.

As with the bit amplifier circuit 20 in the first embodiment described above, the bit amplifier circuit 20a (one example of a capacitive amplifier circuit) detects a voltage generated in the detection electrode 11, and outputs a detection signal obtained by amplifying, based on a capacitance ratio between a capacitor 21 and a capacitor 22, the voltage generated in the detection electrode 11. Moreover, the bit amplifier circuit 20a is configured to be switchable between a function of a capacitive amplifier and a function of a voltage follower by a changeover switch SW2 which is described later. The bit amplifier circuit 20a includes the capacitor 21, the capacitor 22, the operational amplifier 23, and the changeover switch SW2. The bit amplifier circuit 20a is similar to the bit amplifier circuit 20 in the first embodiment except for including the changeover switch SW2.

The changeover switch SW2 is an NMOS transistor, for example, and is connected between an output terminal (node N3) of the operational amplifier 23 and an inverting input terminal (node N2) of the operational amplifier 23. The changeover switch SW2 enters an ON state to cause the bit amplifier circuit 20a to function as the voltage follower. In other words, the changeover switch SW2 switches the bit amplifier circuit 20a between the function of the capacitive amplifier and the function of the voltage follower with a ΦGS signal.

For example, an H state of the ΦGS signal turns on the changeover switch SW2 to cause the bit amplifier circuit 20a to function as the voltage follower. Moreover, an L state of the ΦGS signal turns off the changeover switch SW2 to cause the bit amplifier circuit 20a to function as the capacitive amplifier.

The sampling circuit 30a is a sample-and-hold circuit configured to hold the detection signal provided from the bit amplifier circuit 20a by sampling and holding the detection signal. In order to reduce an offset of the bit amplifier circuit 20a, the sampling circuit 30a holds a reference signal and the detection signal respectively under a condition in which a predetermined voltage is applied to the external electrode 2 by sampling and holding the reference signal and the detection signal. Here, the reference signal is an output signal from the bit amplifier circuit 20a caused to function as the voltage follower by the changeover switch SW2 after the voltage of the detection electrode 11 is reset to a reference potential Vreset by the reset switch SW1, before the predetermined voltage is applied to the external electrode 2.

Moreover, the sampling circuit 30a has NMOS transistors (31, 33, 34, and 36) and capacitors (32 and 35).

The NMOS transistor 34 is connected between the node N3 and a node N12, and has a gate terminal connected to a ΦRIN signal line. An H state of a ΦRIN signal turns on The NMOS transistor 34 to sample the reference signal provided from the bit amplifier circuit 20a, and hold the reference signal in the capacitor 35. Moreover, an L state of the ΦRIN signal turns off the NMOS transistor 34 to stop sampling the reference signal provided from the bit amplifier circuit 20a.

The capacitor 35 is connected between the node N12 and a GND line to hold the sampled reference signal.

The NMOS transistor 36 is connected between the node N12 and a common signal line BL2, and has a gate terminal connected to a ΦSCH signal line. An H state of a ΦSCH signal turns on the NMOS transistor 36 to output the reference signal held by the sampling circuit 30a (capacitor 35) to the common signal line BL2. Moreover, an L state of the ΦSCH signal line turns off the NMOS transistor 36 to stop providing to the common signal line BL2.

To the common signal line BL1 and the common signal line BL2, the sampling circuit 30a of each of the pixel blocks (40a-1, 40a-2, ..., 40a-N) is connected. The sampling circuits 30a of the respective pixel blocks 40a each output the detection signal one pixel at a time to the common signal line BL1 and output the reference signal one pixel at a time to the common signal line BL2 respectively, in response to ΦSCH signals (ΦSCH_1 signal, ΦSCH_2 signal, ..., ΦSCH_N signal) corresponding to the pixel blocks 40a. Moreover, the common signal line BL1 and the common signal line BL2 have a parasitic capacitance SC2.

A gain in the sampling circuit 30a is expressed by the equation (2) given above and the following equation (5).

$$\text{Gain} = Cr/(Cr+Cbitr) \qquad (5)$$

In the equation (5), Cr is a capacitance of the capacitor 35, and Cbitr is a parasitic capacitance of the common signal line BL2.

Moreover, to the common signal line 2, an analog switch AS5 is connected.

The analog switch AS5 has a configuration similar to that of the analog switch AS1 described above, and is connected between the common signal line BL2 and a VREF2 signal line. The analog switch AS5 establishes bidirectional conduction between the common signal line BL2 and the VREF2 signal line in response to a control signal. When the control signal turns on the analog switch AS5, the common signal line BL2 is set to a reference potential VREF2.

The subtraction circuit 50 generates a difference between the reference signal and the detection signal which are held by the sampling circuit 30a. The subtraction circuit 50 generates a differential signal obtained by subtracting the reference signal from the detection signal. The subtraction circuit 50 includes operational amplifiers (51, 52, and 57) and resistors (53 to 56).

The operational amplifier 51 has a non-inverting input terminal connected to the common signal line BL2, and an output terminal (node N13) connected to an inverting input terminal thereof. The operational amplifier 51 functions as a voltage follower having unity gain (a gain of 1), and outputs a signal equal to the reference signal acquired via the common signal line BL2 to the output terminal (node N13).

The operational amplifier 52 has a non-inverting input terminal connected to the common signal line BL1, and an output terminal (node N14) connected to an inverting input terminal thereof. The operational amplifier 52 functions as a voltage follower having unity gain (a gain of 1), and outputs a signal equal to the detection signal acquired via the common signal line BL1 to the output terminal (node N14).

The resistor 53 is connected between the node N13 and a node N16, and the resistor 54 is connected between the node N16 and a node N17. Moreover, the resistor 55 is connected between the node N14 and a node N15, and the resistor 56 is connected between the node N15 and the VREF2 signal line.

The operational amplifier 57 has a non-inverting input terminal connected to the node N15, an inverting input terminal connected to the node N16, and an output terminal connected to the node N17. Here, the resistor 53 to the resistor 56 and the operational amplifier 57 form the subtraction circuit configured to subtract the reference signal from the detection signal. The operational amplifier 57 outputs, to the output terminal (node N17), the differential signal obtained by subtracting the reference signal acquired via the common signal line BL2 from the detection signal acquired via the common signal line BL1 as the detection signal from which the offset of the bit amplifier circuit 20a is removed.

The output processing circuit 60a acquires the differential signals of the subtraction circuits 50 as the detection signals of the pixel blocks 40a one bit (one pixel) at a time, amplifies the acquired detection signals, and outputs the amplified detection signals from a SIG terminal. The output processing circuit 60a is similar to the output processing circuit 60 in the first embodiment except for absence of the operational amplifier 61, and hence a description thereof is omitted here.

As with the timing control circuit 70 in the first embodiment, the timing control circuit 70a generates various timing signals for controlling the sensor device 1a. The timing control circuit 70a generates the various timing signals to perform the following timing control (A) to (C), for example.

(A) Resetting the voltage of the detection electrode 11 to the reference potential Vreset by the reset switch SW1, and causing the bit amplifier circuit 20a to function as the voltage follower by the changeover switch SW2.

(B) Further holding the reference signal by the sampling circuit 30a after releasing from a state in which the voltage of the detection electrode 11 is reset to the reference potential Vreset by the reset switch SW1, and releasing of the bit amplifier circuit 20a from the function as the voltage follower by the changeover switch SW2.

(C) Releasing of the bit amplifier circuit 20a from the function as the voltage follower by the changeover switch SW2, and holding the detection signal by the sampling circuit 30a after elapse of the predetermined period TR1 since the application of the predetermined voltage to the external electrode 2.

The timing control circuit 70a includes a shift resistor 71 and a timing signal generation circuit 72a.

The timing signal generation circuit 72a generates a ΦR signal, the ΦGS signal, the ΦRIN signal, a ΦSIN signal, a ΦI signal, and control signals for controlling the various analog switches (AS1 to AS5), for example, and outputs the generated signals to the components.

Next, operation of the sensor device 1a according to the second embodiment is described with reference to the accompanying drawings.

Figure 4:
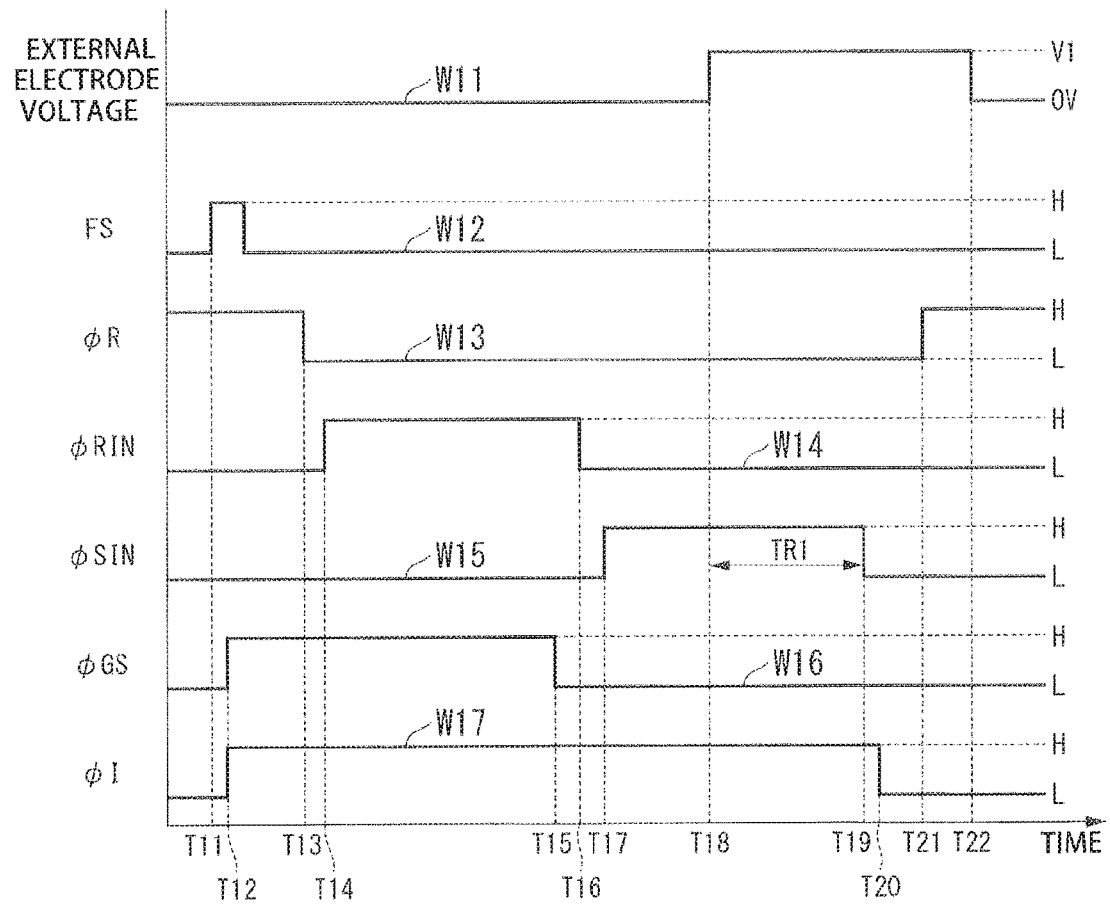
FIG. 4 is a timing chart for showing an example of operation of the sensor device according to the second embodiment.

FIG. 4 is a timing chart for showing one example of the operation of the sensor device 1a according to the second embodiment.

In the one example shown in FIG. 4, a description is given of operation of the sensor device 1a until the voltage of the detection electrode 11 is detected and the detected detection signal is held by the sampling circuit 30a.

In FIG. 4, a waveform W11 indicates a waveform of the voltage of the external electrode 2(external electrode voltage). Moreover, a waveform W12 to a waveform W17 indicate, in order from above, a logic state of the FS signal, a logic state of the ΦR signal, a logic state of the ΦRIN signal, a logic state of the ΦSIN signal, a logic state of the ΦGS signal, and a logic state of the ΦI signal. In FIG. 4, the horizontal axis indicates time.

As shown in FIG. 4, it is assumed that the timing signal generation circuit 72a sets, as an initial condition, the ΦR signal to the H state and the ΦSIN signal and the ΦI signal to the L state. In this condition, the reset switch SW1 enters the ON state to reset the voltage of the detection electrode 11 to the reference potential Vreset. Under this condition, when the FS signal is set to a H state at time T11, the timing signal generation circuit 72a sets the ΦI signal and the ΦGS signal to H states at time T12 (see the waveform W17 and the waveform W16), to thereby start operation of the operational amplifier 23 and turns on the changeover switch SW2 such that the bit amplifier circuit 20a functions as the voltage follower.

Next, when the timing signal generation circuit 72a sets the ΦR signal to the L state at time T13 (see the waveform W13), the reset switch SW1 enters the OFF state.

Next, when the timing signal generation circuit 72a sets the ΦRIN signal to the H state at time T14 (see the waveform W14), the NMOS transistor 34 of the sampling circuit 30a enters the ON state to accumulate an output signal (reference signal) of the bit amplifier circuit 20a in the capacitor 35.

Next, the timing signal generation circuit 72a sets the ΦGS signal to the L state (see the waveform W16) at time T15, and sets the ΦRIN signal to an L state at time T16 (see the waveform W14). As a result, the NMOS transistor 34 enters an OFF state to complete the sampling and holding in response to the ΦRIN signal, and hold in the capacitor 35 the reference signal containing noise generated when the ΦR signal and the ΦGS signal each transition from an H state to an L state. Here, the reference signals of all pixels of one line of the pixel block 40a-1, the pixel block 40a-2, . . . , the pixel block 40a-N are held by the respective sampling circuits 30a.

Moreover, the ΦGS signal is set to the L state such that the changeover switch SW2 enters the OFF state and the bit amplifier circuit 20a functions as the capacitive amplifier.

Next, when the timing signal generation circuit 72a sets the ΦSIN signal to a H state (see the waveform W15) at time T17, the NMOS transistor 31 of the sampling circuit 30a enters an ON state to accumulate the output signal of the bit amplifier circuit 20a in the capacitor 32.

Next, when a predetermined voltage V1 is applied to the external electrode 2 at time T18 (see the waveform W11), a voltage corresponding to a change in capacitance caused by a thickness of a paper sheet is generated in the detection electrode 11. The bit amplifier circuit 20a outputs the detection signal obtained by amplifying the voltage generated in the detection electrode 11 with the gain of the equation (1) described above to a node N3, and the amplified detection signal is accumulated in the capacitor 32 via the NMOS transistor 31.

Next, at time T19, the timing signal generation circuit 72a sets the ΦSIN signal to the L state (see the waveform W15) after the predetermined period TR1 has elapsed since the application of the predetermined voltage V1 to the external electrode 2. Here, the predetermined period TR1 is a period enough for the detection signal that has been amplified by the operational amplifier 23 to be accumulated in the capacitor 32 of the sampling circuit 30a. When the ΦSIN signal is set to the L state, the NMOS transistor 31 enters an OFF state to complete the sampling and holding in response to the ΦSIN signal, and hold the amplified detection signal in the capacitor 32. Here, the detection signals of all pixels of one line of the pixel block 40a-1, the pixel block 40a-2, . . . , the pixel block 40a-N are held by the respective sampling circuits 30a.

As described above, the sampling circuit 30a holds the reference signal after the voltage of the detection electrode 11 is reset to the reference potential Vreset by the reset switch SW1, and the bit amplifier circuit 20a is caused to function as the voltage follower by the changeover switch SW2, and further a state in which the voltage of the detection electrode 11 is reset to the reference potential Vreset is released by the reset switch SW1, and the function as the voltage follower is released by the changeover switch SW2. Then, the function as the voltage follower is released by the changeover switch SW2, and the sampling circuit 30a holds the detection signal after the predetermined period has elapsed since the application of the predetermined voltage to the external electrode 2.

Next, at time T20, the timing signal generation circuit 72a sets the ΦI signal to the L state to stop the operation of the operational amplifier 23.

Moreover, at time T21, the timing signal generation circuit 72a sets the ΦR signal to the H state such that the reset switch SW1 enters the ON state to reset the detection electrode 11 to the reference potential Vreset.

Next, at time T22, the application of the predetermined voltage V1 to the external electrode 2 is stopped, and the voltage (external electrode voltage) of the external electrode 2 becomes 0 V, for example (see the waveform W11).

Next, referring to FIG. 3, description is made to the operation of generating the difference between the detection signal and the reference signal which are held by the sampling circuit 30a, and providing serial output of the difference as the detection signal from which the offset is removed.

After the sampling circuit 30a holds the detection signal and the reference signal, the timing signal generation circuit 72a first turns on the analog switch AS1, the analog switch AS5, and the analog switch AS2 to set the common signal line BL1, the common signal line BL2, and a node N6 to the reference potential VREF2.

Next, after the timing signal generation circuit 72a turns off the analog switch AS1, the analog switch AS5, and the analog switch AS2, the shift resistor 71 sets a ΦSCH_1 signal to a H state. As a result, the timing signal generation circuit 72a turns on the NMOS transistor 33 of the pixel block 40a-1 to output the detection signal held by the sampling circuit 30a to the common signal line BL1, and turns on the NMOS transistor 36 of the pixel block 40a-1 to output the reference signal held by the sampling circuit 30a to the common signal line BL2.

Next, the subtraction circuit 50 generates the differential signal obtained by subtracting the reference signal from the detection signal, and outputs the differential signal to the node N17.

Next, the output processing circuit 60a acquires the differential signal of the subtraction circuit 50 as the detection signal, amplifies the acquired detection signal, and outputs the amplified detection signal from the SIG terminal.

Next, the timing control circuit 70a executes processing similar to that for the pixel block 40a-1 on the pixel block 40a-2. In this case, the shift resistor 71 is shifted by a CLK signal to set a ΦSCH_2 signal to a H state such that the output processing circuit 60a outputs a detection signal of the pixel block 40a-2 as a detection voltage of one pixel to the SIG terminal.

The timing control circuit 70a repeats such processing until a detection signal of the pixel block 40a-N is provided to the SIG terminal.

As described above, the sensor device 1a according to the second embodiment includes the detection electrode 11, the bit amplifier circuit 20a (capacitive amplifier circuit), the reset switch SW1, the changeover switch SW2, the sampling circuit 30a, and the subtraction circuit 50. The detection electrode 11 opposes the external electrode 2 to which the predetermined voltage V1 is applied, and the voltage corresponding to the change in capacitance is generated therein. The bit amplifier circuit 20a includes the capacitor 21 (first capacitor) and the capacitor 22 (second capacitor) which are connected in series to each other, to detect the voltage generated in the detection electrode 11, and output the detection signal obtained by amplifying, based on the capacitance ratio between the capacitor 21 and the capacitor 22, the voltage generated in the detection electrode 11. The reset switch SW1 resets the voltage of the detection electrode 11 to the reference potential Vreset. The changeover switch SW2 switches the bit amplifier circuit 20a between the function as the capacitive amplifier and the function as the voltage follower. The sampling circuit 30a holds the reference signal and the detection signal under the state in which the predetermined voltage is applied to the external electrode 2 by sampling and holding the reference signal and the detection signal. Here, the reference signal is the output signal from the bit amplifier circuit 20a caused to function as the voltage follower by the changeover switch SW2 after the voltage of the detection electrode 11 is reset to the reference potential Vreset by the reset switch SW1, before the predetermined voltage is applied to the external electrode 2. The subtraction circuit 50 generates the difference between the reference signal and the detection signal which are held by the sampling circuit 30a.

As a result, the sensor device 1a according to the second embodiment can provide effects similar to those of the first embodiment, reduce the effects of noise, and improve detection accuracy.

Moreover, the sensor device 1a according to the second embodiment can reduce the offset of the bit amplifier circuit 20a from the detection signal because the subtraction circuit 50 generates the difference between the reference signal and the detection signal. Accordingly, the sensor device 1a according to the second embodiment can further improve the detection accuracy.

Moreover, in the second embodiment, the bit amplifier circuit 20a is a non-inverting amplifier circuit including the operational amplifier 23 which has the capacitor 22 connected between the output terminal and the inverting input terminal thereof, has the capacitor 21 connected between the inverting input terminal and a GND line (reference potential line), and has the detection electrode 11 connected to a non-inverting input terminal thereof. The subtraction circuit 50 generates the differential signal obtained by subtracting the reference signal from the detection signal.

As a result, the sensor device 1a according to the second embodiment can amplify the voltage generated in the detection electrode 11 while reducing the offset with a simple configuration.

Moreover, in the second embodiment, the sampling circuit 30a holds the reference signal after the voltage of the detection electrode 11 is reset to the reference potential Vreset by the reset switch SW1, and the bit amplifier circuit 20a is caused to function as the voltage follower by the changeover switch SW2, and further release from a state in which the voltage of the detection electrode 11 is reset to the reference potential Vreset is made by the reset switch SW1, and release from a state in which the function as the voltage follower is assigned to is made by the changeover switch SW2. Moreover, the sampling circuit 30a holds the detection signal after the function as the voltage follower is released by the changeover switch SW2, and the predetermined period elapses (period TR1 elapses) since the application of the predetermined voltage V1 to the external electrode 2.

As a result, the sampling circuit 30a holds the reference signal containing switching noise of the reset switch SW1 and the changeover switch SW2. Accordingly, the sensor device 1a according to the second embodiment can reduce the offset as well as the switching noise of the reset switch SW1 and the changeover switch SW2 with the difference between the detection signal and the reference signal.

Moreover, the sensor device 1a according to the second embodiment includes the timing control circuit 70a. The timing control circuit 70a performs the following timing control (A) to (C).

(A) Resetting the voltage of the detection electrode 11 to the reference potential Vreset by the reset switch SW1, and causing the bit amplifier circuit 20a to function as the voltage follower by the changeover switch SW2

(B) Further holding the reference signal by the sampling circuit 30a after releasing from the state in which the voltage of the detection electrode 11 is reset to the reference potential Vreset by the reset switch SW1, and releasing of the bit amplifier circuit 20a from the function as the voltage follower by the changeover switch SW2

(C) Releasing of the bit amplifier circuit 20a from the function as the voltage follower by the changeover switch SW2, and holding the detection signal by the sampling circuit 30a after elapse of the predetermined period TR1 since the application of the predetermined voltage to the external electrode 2

As a result, the sensor device 1a according to the second embodiment can reduce the offset as well as the switching noise of the reset switch SW1 and the changeover switch SW2 as described above with the difference between the detection signal and the reference signal. Moreover, the sensor device 1a according to the second embodiment includes the timing control circuit 70a, and hence it is not required to externally perform complicated timing control.

Third Embodiment

Next, a sensor device 1b according to the third embodiment of the present invention is described with reference to the accompanying drawings.

In the third embodiment, a modification example of the bit amplifier circuit 20a according to the second embodiment is described.

Figure 5:
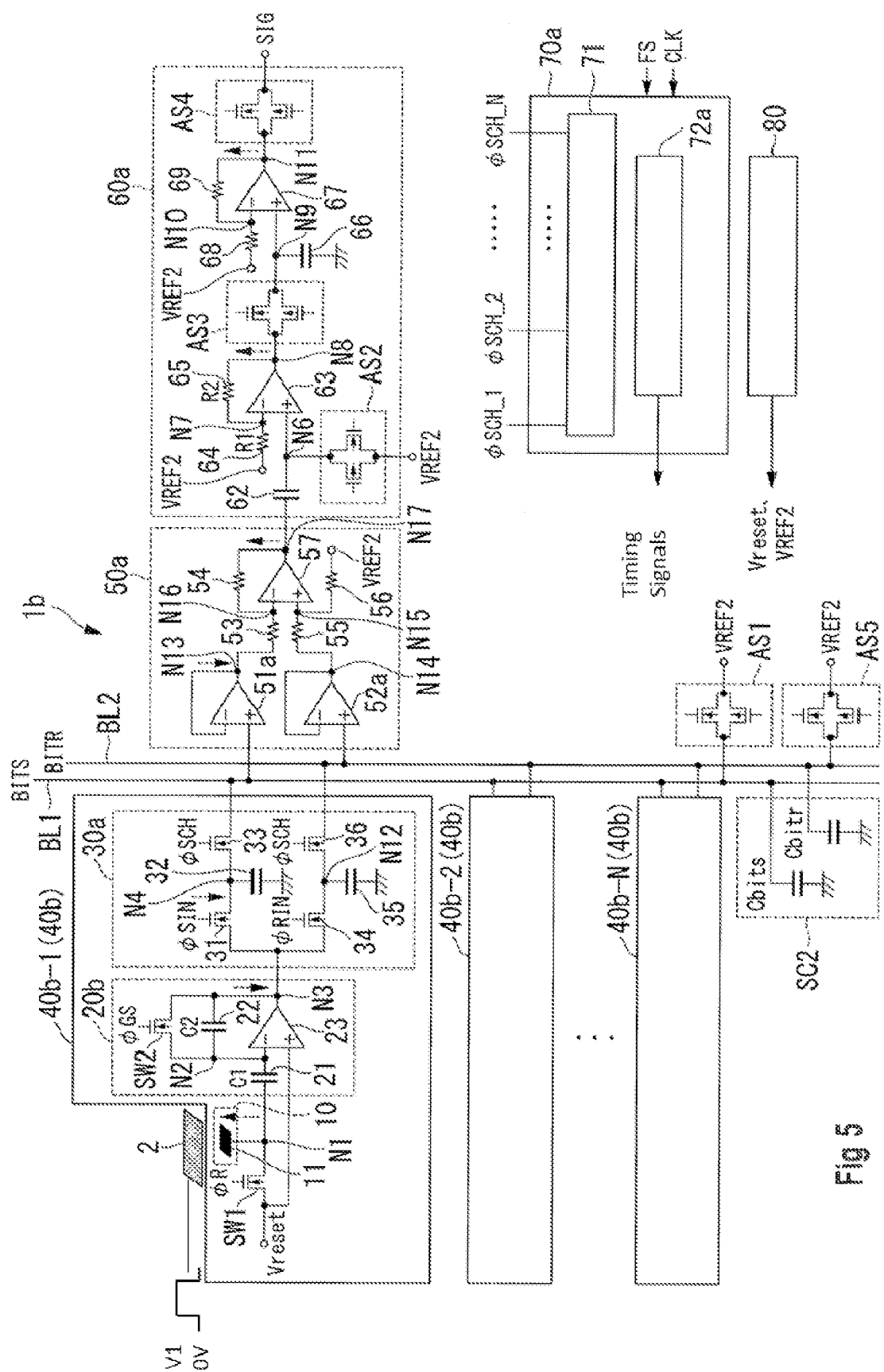
FIG. 5 is a block diagram for illustrating an example of a sensor device according to a third embodiment of the present invention.

FIG. 5 is a block diagram for illustrating one example of the sensor device 1b according to the third embodiment.

As illustrated in FIG. 5, the sensor device 1b includes the external electrode 2, pixel blocks (40b-1, 40b-2, ..., 40b-N), a subtraction circuit 50a, the output processing circuit 60a, the timing control circuit 70a, and the reference voltage generation circuit 80.

In FIG. 5, the same components as those of the second embodiment illustrated in FIG. 3 are denoted by the same reference symbols, and a description thereof is omitted.

Moreover, in the third embodiment, the pixel blocks (40b-1, 40b-2, ..., 40b-N) have the same configuration, and are described as the pixel block(s) 40b when any one of the pixel blocks included in the sensor device 1b is referred to, or when the pixel blocks are not particularly distinguished from one another.

The pixel block 40b is a block configured to detect the electric field (thickness) of a pixel corresponding to one pixel, and includes the detection electrode 11, a bit amplifier circuit 20b, the sampling circuit 30a, and the reset switch SW1.

As with the bit amplifier circuit 20a in the second embodiment described above, the bit amplifier circuit 20b (one example of a capacitive amplifier circuit) detects a voltage generated in the detection electrode 11, and outputs a detection signal obtained by amplifying, based on a capacitance ratio between the capacitor 21 and the capacitor 22, the voltage generated in the detection electrode 11. The bit amplifier circuit 20b includes the capacitor 21, the capacitor 22, the operational amplifier 23, and the changeover switch SW2. The bit amplifier circuit 20b is an inverting amplifier circuit including the operational amplifier 23, which has the capacitor 22 connected between an output terminal and an inverting input terminal thereof, has the capacitor 21 connected between the inverting input terminal and the detection electrode 11, and has a Vreset signal line (reference potential line) connected to a non-inverting input terminal thereof. Here, the bit amplifier circuit 20b (operational amplifier 23) outputs the detection signal in a negative direction as an inverted signal.

The operational amplifier 23 has the inverting input terminal connected to a node N1 via the capacitor 21, and the non-inverting input terminal connected to the Vreset signal line.

The subtraction circuit 50a generates a difference between a reference signal and the detection signal which are held by the sampling circuit 30a. The subtraction circuit 50a generates a differential signal obtained by subtracting the detection signal from the reference signal. The subtraction circuit 50a includes operational amplifiers (51a, 52a, and 57) and resistors (53 to 56).

The operational amplifier 51a has a non-inverting input terminal connected to a common signal line BL1, and an output terminal (node N13) connected to an inverting input terminal thereof.

The operational amplifier 52a has a non-inverting input terminal connected to a common signal line BL2, and an output terminal (node N14) connected to an inverting input terminal thereof.

The resistor 53 to the resistor 56 and the operational amplifier 57 form the subtraction circuit configured to subtract the detection signal from the reference signal. The operational amplifier 57 outputs, to an output terminal (node N17), the differential signal obtained by subtracting the detection signal acquired via the common signal line BL1 from the reference signal acquired via the common signal line BL2 as the detection signal from which an offset of the bit amplifier circuit 20b is removed.

Operation of the sensor device 1b according to the third embodiment is similar to that in the second embodiment except that the bit amplifier circuit 20b is the inverting amplifier circuit, and that the subtraction circuit 50a subtracts the detection signal from the reference signal, and hence a description thereof is omitted here.

As described above, the sensor device 1b according to the third embodiment includes the detection electrode 11, the bit amplifier circuit 20b (capacitive amplifier circuit), the reset switch SW1, the changeover switch SW2, the sampling circuit 30a, and the subtraction circuit 50a.

As a result, the sensor device 1b according to the third embodiment can provide effects similar to those of the first and second embodiments, reduce effects of noise, and improve detection accuracy.

Moreover, the sensor device 1b according to the third embodiment can reduce the offset of the bit amplifier circuit 20b from the detection signal because the subtraction circuit 50a generates the difference between the reference signal and the detection signal. Accordingly, the sensor device 1b according to the third embodiment can further improve the detection accuracy.

Moreover, in the third embodiment, the bit amplifier circuit 20b is the inverting amplifier circuit including the operational amplifier 23, which has the capacitor 22 connected between the output terminal and the inverting input terminal thereof, has the capacitor 21 connected between the inverting input terminal and the detection electrode 11, and has the Vreset signal line (reference potential line) connected to the non-inverting input terminal thereof. The subtraction circuit 50a generates the differential signal obtained by subtracting the detection signal from the reference signal.

As a result, the sensor device 1b according to the third embodiment can amplify the voltage generated in the detection electrode 11 while reducing the offset with a simple configuration.

The present invention is not limited to the embodiments described above, and can be modified without departing from the spirit of the present invention.

For example, in the embodiments described above, the example in which the timing control circuit 70 (70a) generates the various timing signals has been described. However, the present invention is not limited thereto, and some or all of the various timing signals generated by the timing control circuit 70 (70a) may be externally supplied.

Moreover, in the embodiments described above, the example in which the reference voltage generation circuit 80 generates the reference voltages, such as the reference potential Vreset and the reference potential VREF2, has been described. However, the present invention is not limited thereto, and some or all of the reference voltages generated by the reference voltage generation circuit 80 may be externally supplied.

Moreover, in the embodiments described above, there has been described the example in which the pixel blocks 40 (40a, 40b) detect the detection signals for all pixels at once, hold the detection signals in the sampling circuits 30 (30a), and sequentially and serially output the detection signals, but the present invention is not limited thereto. The timing control circuit 70 (70a) may perform the timing control such that the pixel blocks 40 (40a, 40b) sequentially output the detection signal while detecting the detection signals one pixel (one bit) at a time, for example.

Moreover, in the embodiments described above, the example in which the output processing circuit 60 (60a) amplifies the detection signal in two stages has been described, but the present invention is not limited thereto. When a sufficient dynamic range can be secured with one-step amplification, for example, the output processing circuit 60 (60a) may amplify the detection signal in one stage.

Moreover, in the embodiments described above, the example in which the sensor device 1 (1a, 1b) is a line image sensor device has been described. However, the present invention is not limited thereto, and the sensor device 1 (1a, 1b) may be a two-dimensional image sensor device.

Moreover, in the embodiments described above, there has been described the example in which the external electrode 2 is formed as one electrode for all the detection electrodes 11 included in the sensor device 1. However, the present invention is not limited thereto, and the external electrode 2 may be formed of a plurality of divided electrodes, for example. Moreover, the external electrode 2 may be formed as a plurality of electrodes respectively corresponding to the plurality of detection electrodes 11, for example.

Moreover, in the first embodiment described above, the example in which the bit amplifier circuit 20 is formed of the non-inverting amplifier circuit has been described, but may be formed of the inverting amplifier circuit as in the third embodiment.

Moreover, the timing control circuit 70 (70a) described above may include a computer system therein. At this time, the above-mentioned processing step of detecting the output of the detection electrode 11 is stored in a form of a program in a computer-readable storage medium, and the above-mentioned processing is performed by reading and executing the program by a computer. The "computer-readable storage medium" as used herein refers to a magnetic disk, an magneto-optical disk, a CD-ROM, a DVD-ROM, or a semiconductor memory, for example. Moreover, the computer program may be distributed to the computer through a communication line, and the computer that has received the distributed program may execute the program.

What is claimed is:

1. A sensor device, comprising:
a plurality of detection electrodes opposing an external electrode to each of which a predetermined voltage is applied, and wherein each one of the plurality of detection electrodes is configured to generate a voltage corresponding to a change in electrostatic capacitance, wherein the external electrode is formed as one electrode for all of the plurality of detection electrodes included in the sensor device;
a capacitive amplifier circuit having a first capacitor and a second capacitor connected in series to each other, and configured to detect the voltage generated in a first detection electrode of the plurality of detection electrodes and output a first detection signal obtained by amplifying the voltage generated in the first detection electrode based on a capacitance ratio between the first capacitor and the second capacitor;
a reset switch configured to reset the voltage of the first detection electrode to a reference potential;
a changeover switch configured to switch the capacitive amplifier circuit between a function as a capacitive amplifier and a function as a voltage follower;
a sampling circuit configured to sample and hold a reference signal and the first detection signal respectively, the reference signal being an output signal from the capacitive amplifier circuit before the predetermined voltage is applied to the external electrode, the first detection signal being obtained with the predetermined voltage applied to the external electrode, while the capacitive amplifier circuit is caused to function as the voltage follower by the changeover switch after a voltage of the first detection electrode is reset to the reference potential by the reset switch; and
a subtraction circuit configured to generate a difference between the reference signal and the first detection signal held by the sampling circuit.

2. A sensor device according to claim 1,
wherein the capacitive amplifier circuit comprises a non-inverting amplifier circuit including an operational amplifier having the second capacitor connected between an output terminal and an inverting input terminal thereof, having the first capacitor connected between the inverting input terminal and a reference potential line, and having the first detection electrode connected to a non-inverting input terminal thereof, and
wherein the subtraction circuit is configured to generate a differential signal obtained by subtracting the reference signal from the first detection signal.

3. A sensor device according to claim 2, wherein the sampling circuit is configured to:
hold the reference signal after the voltage of the first detection electrode is reset to the reference potential by the reset switch, and the capacitive amplifier circuit is caused to function as the voltage follower by the changeover switch, and further release from a state in which the voltage of the first detection electrode is reset to the reference potential is made by the reset switch, and release from the function as the voltage follower is made by the changeover switch; and
hold the first detection signal after the release from the function as the voltage follower by the changeover switch, and elapse of a predetermined period since the application of the predetermined voltage to the external electrode.

4. A sensor device according to claim 1,
wherein the capacitive amplifier circuit comprises an inverting amplifier circuit including an operational amplifier, having the second capacitor connected between an output terminal and an inverting input terminal thereof, having the first capacitor connected between the inverting input terminal and the first detection electrode, and having a reference potential line connected to a non-inverting input terminal thereof, and
wherein the subtraction circuit is configured to generate a differential signal obtained by subtracting the first detection signal from the reference signal.

5. A sensor device according to claim 4, wherein the sampling circuit is configured to:
hold the reference signal after the voltage of the first detection electrode is reset to the reference potential by the reset switch, and the capacitive amplifier circuit is caused to function as the voltage follower by the changeover switch, and further release from a state in which the voltage of the first detection electrode is reset to the reference potential is made by the reset switch, and release from the function as the voltage follower is made by the changeover switch; and
hold the first detection signal after the release from the function as the voltage follower by the changeover switch, and elapse of a predetermined period since the application of the predetermined voltage to the external electrode.

6. A sensor device according to claim 1, wherein the sampling circuit is configured to:
hold the reference signal after the voltage of the first detection electrode is reset to the reference potential by the reset switch, and the capacitive amplifier circuit is caused to function as the voltage follower by the changeover switch, and further release from a state in which the voltage of the first detection electrode is reset to the reference potential is made by the reset switch, and release from the function as the voltage follower is made by the changeover switch; and
hold the first detection signal after the release from the function as the voltage follower by the changeover switch, and elapse of a predetermined period since the application of the predetermined voltage to the external electrode.

7. A sensor device according to claim 1, further comprising a timing control circuit configured to perform the following timing control:
resetting the voltage of the first detection electrode to the reference potential by the reset switch, and causing the capacitive amplifier circuit to function as the voltage follower by the changeover switch;
further holding the reference signal by the sampling circuit after a state in which the voltage of the first detection electrode is reset to the reference potential is released by the reset switch, and release from the function as the voltage follower is made by the changeover switch; and
holding the first detection signal by the sampling circuit after release from the function as the voltage follower is made by the changeover switch, and elapse of a predetermined period after the application of the predetermined voltage to the external electrode.

8. A sensor device according to claim 1, further comprising:
the plurality of detection electrodes arranged in line; and
a plurality of capacitive amplifier circuits respectively corresponding to individual ones of the plurality of detection electrodes.

* * * * *